United States Patent [19]

Beak

[11] Patent Number: 5,496,185
[45] Date of Patent: Mar. 5, 1996

[54] CONNECTING DEVICE OF DATA CABLE

[75] Inventor: Soon K. Beak, Kyungki-do, Rep. of Korea

[73] Assignee: Samsung Electronics Co., Ltd., Kyungki-do, Rep. of Korea

[21] Appl. No.: 273,213

[22] Filed: Jul. 11, 1994

[51] Int. Cl.[6] .................................................. H01R 13/648
[52] U.S. Cl. ........................................ 439/95; 439/76.1
[58] Field of Search ................................ 439/95–97, 76

[56] References Cited

U.S. PATENT DOCUMENTS

| | | | |
|---|---|---|---|
| 2,980,881 | 4/1961 | McKee | 439/682 |
| 4,720,155 | 1/1988 | Schildkraut et al. | 439/95 |
| 4,823,235 | 4/1989 | Suzuki et al. | 439/76 |
| 4,889,497 | 12/1989 | Riches | 439/95 |
| 5,381,308 | 1/1995 | Wolpert et al. | 439/96 |

*Primary Examiner*—Gary F. Paumen
*Attorney, Agent, or Firm*—Ladas & Parry

[57] ABSTRACT

A connecting device of data cable is disclosed, wherein the device includes an elastic connecting member and a fixing member to be connected with the signal input/output part of a printed circuit board and the chassis frame so as to prevent the signal terminal part from separating from the main body and thereby to completely discharge the electromagnetic wave generated around the signal terminal part to the chassis frame.

11 Claims, 3 Drawing Sheets

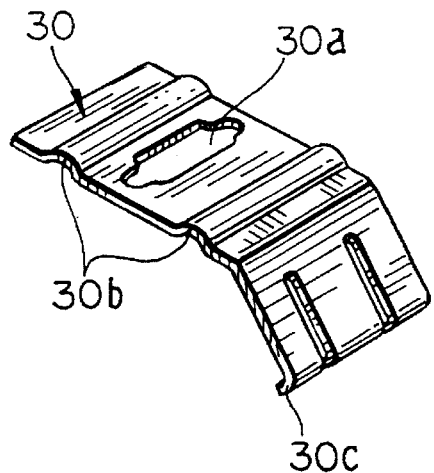
FIG. 4
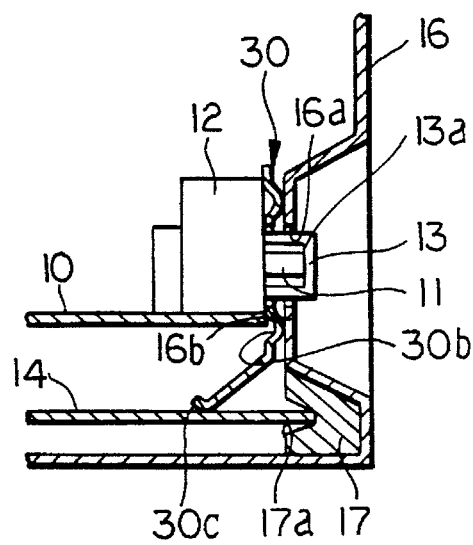
FIG. 5
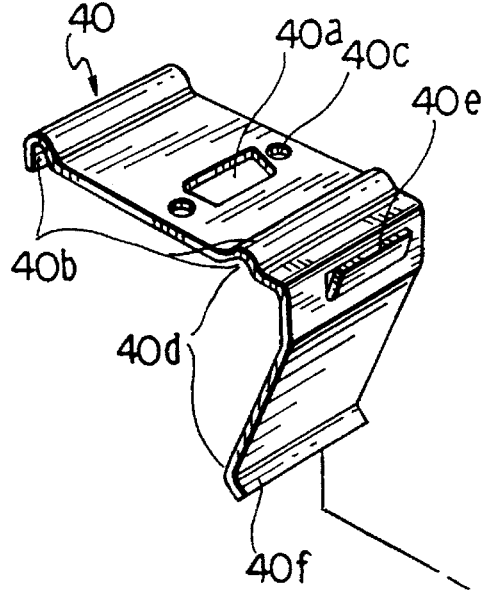
FIG. 6
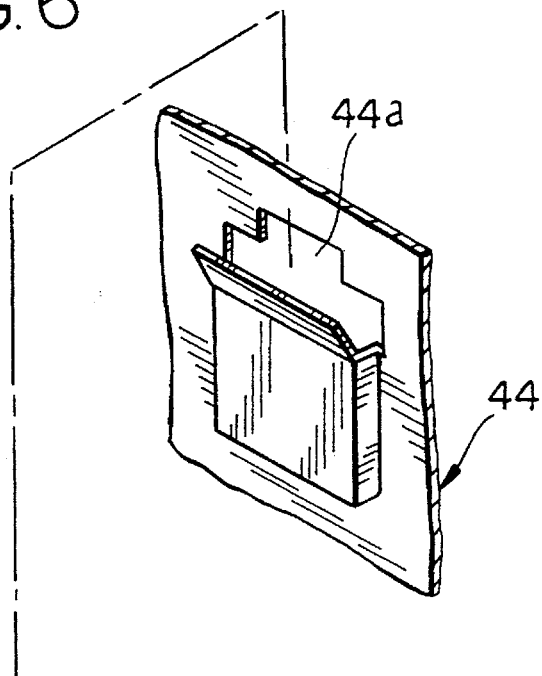

CONNECTING DEVICE OF DATA CABLE

BACKGROUND OF THE INVENTION

1. Field of the Invention

The present invention relates to a device for use with a connector assembly for data cable (hereinafter abbreviated to connector assembly). More particularly the present invention describes a device that, when used as described, stabilizes a connector assembly for data cable in an outwardly fixed position of a personal computer system and shields electromagnetic wave from the system.

2. Description of the Prior Art

A connector assembly for data cable (monochrome or color/graphic type) in conventional personal computer systems is led to a monitor through an input/output terminal which is placed at the back side of the system. Into pin holes (for example, nine pin holes) of the input/output terminal a plug attached to a monitor cable is inserted to provide signal transmission from the system to the monitor. The connector assembly, in general, is fixed and supported by settling means for its stable placement.

FIGS. 1 to 3 show configurations with respect to a conventional connector assembly for data cable. A signal terminal part 12 having input/output terminal 13 in which a plurality of signal pin holes 13a are formed is mounted on a printed circuit board 10. One of two nuts 11 attached to the signal terminal part 12, on both sides of the input/output terminal 13, keeps metal ring 15a in contact with the signal terminal part 12. The metal ring 15a is connected to chassis frame 14 through a wire 15 which is bonded to the chassis frame 14 by soldering, so that electromagnetic wave generated from the signal terminal part 12 can be discharged to the chassis frame 14. The chassis frame 14, as shown in FIG. 2, is fixed into a guiding gully 17a of a guiding rail 17 which is attached to a case 16 of the system by screw binding or bonding. The printed circuit board 10 over the chassis frame 14 is laid on a shoulder 17b of the guiding rail 17. The outwardly exposed portion, including the input/output terminal 13 and the nuts 11 of the signal terminal part 12, is defined by an opening 16a of the case 16, as shown in FIG. 3.

In fabricating the conventional structure, the metal ring 15a is fixed in the space between the outwardly exposed surface of the signal terminal part 12 and the nut 11, using a specific screwing tool such as a driver, and then the wire 15 is bonded to the chassis frame 14 by soldering. After completion of the construction for electromagnetic wave discharge (or shielding), the connector assembly is forced into the opening 16a manually so that the portion including the input/output terminal 13 and the nuts 11 project out of the case 16 through the opening 16a. This makes the mounting process of the connector assembly complicated. Furthermore, while the signal terminal part 12 is mounted in the case 16, the wire 15 can be detached from the chassis frame 14 due to quaking of the connector assembly, resulting in loss of the electromagnetic wave discharge function. Those problems caused by lack of structural stability would detract from the reliability of the connector assembly for data cable.

SUMMARY OF THE INVENTION

It is accordingly an object of the present invention to provide a device overcoming the above enumerated faults.

Another object of the present invention is to provide a device which when arranged in a personal computer system stabilizes a connector assembly for data cable and shields electromagnetic wave from the system.

A further object of the present invention is to provide a connector assembly for data cable having an electromagnetic wave shielding means which can be arranged in a simpler manner than that of the conventional assembly with high reliability.

To achieve these and other objects, according to the present invention, a connector assembly for data cable in which a signal terminal part is fastened with nuts on a printed circuit board and in which an input/output terminal of the signal terminal part comprises a plurality of pin holes formed at one side of the input/output terminal, comprises an elastic connecting means comprising a guide opening in the center thereof for inserting an input/output terminal fixed at one end of the signal terminal part to discharge electromagnetic waves to be generated around the input/output terminal to a chassis frame installed in a case of a main body in a computer system, and fixing means for stably supporting said elastic connecting means.

There are variable alternative configurations in accordance with the present invention. First, the bending portion has a folded angle less than 90° and contacts a surface of the chassis frame. In a second embodiment, the bending portion has a folded angle more than 90° and includes a latch mouth wherein the chassis frame includes a suspending hollow shaped thereon, so that the bending portion is fitted into the suspending hollow by the latch mouth. In a third configuration, the bending portion has a folded angle of 90° and includes a frame holder wherein the chassis frame includes a connecting plate shaped thereon, so that the connecting plate is inserted into the frame holder.

These and other objects will become apparent from the following detailed description taken in connection with the accompanying drawings.

BRIEF DESCRIPTION OF THE DRAWINGS

FIG. 4 is a perspective view illustrating an elastic sheet of data cable according to an embodiment of the present invention.

FIG. 5 is a cross-sectional view illustrating an arranged configuration when a signal terminal part is mounted in a case of a system by means of the device shown in FIG. 4.

FIG. 6 is a perspective view illustrating a device according to another embodiment of the present invention.

DETAILED DESCRIPTION OF THE PREFERRED EMBODIMENT

Reference is now made to FIGS. 4 through 10 in which the same reference symbols designate like or corresponding elements throughout all of the drawings. In addition, the shapes of the connector assembly for data cable and the case of personal computer system are the same throughout several views.

Figure 1:
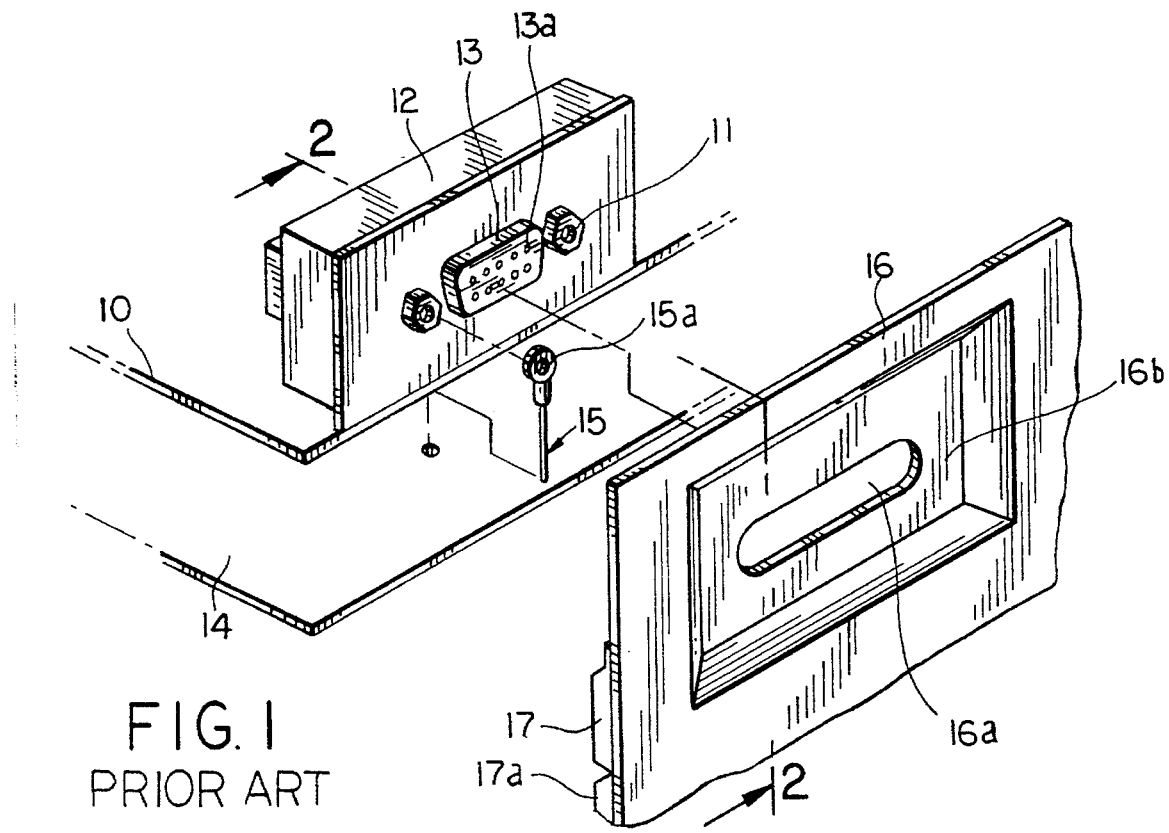
FIG. 1 is a perspective exploded view showing a configuration of a conventional connector assembly for data cable.
Figure 2:
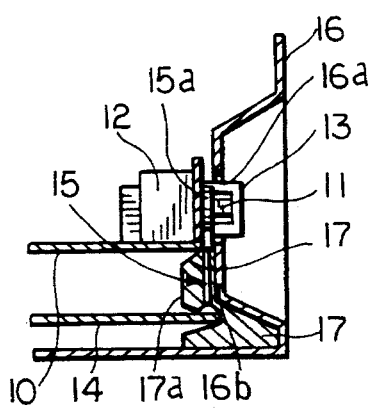
FIG. 2 is a cross-sectional view taken along a line II—II in FIG. 1.
Figure 3:
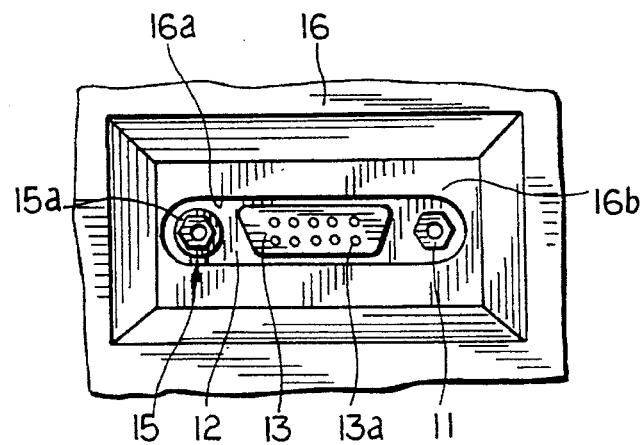
FIG. 3 is a front elevation assembly view of FIG. 1.

FIGS. 4 and 5 illustrate the configurations with respect to the first embodiment according to the present invention. Referring to FIG. 4, the device in accordance with the first embodiment employs an elastic sheet 30 formed of an elastic metal material. The sheet 30 has a part including a guide opening 30a to be used for allowing the input/output terminal 13 and nuts 11 to be inserted therein. At the upper and lower parts from the guide opening 30a reinforce ribs 30b are formed in a curving shape. Further, the sheet 30 has a bending portion 30c bent in an angle less than 90 degree at the other part thereof. When the sheet 30 is arranged in a personal computer system, as shown in FIG. 5, the end of the bending portion 30c is directed to chassis frame 14 electrically connected to the ground and contacted to the surface of the chassis frame 14. The bending portion 30c acts as a supporting means for the signal terminal part 12, as well as a contacting means for discharging the electromagnetic wave from the signal terminal part 12 into the ground through the chassis frame 14. Since the sheet 30 has a restoring force to return to its natural condition, the bending portion 30c may be itself forced to contact the surface of the chassis frame 14. The input/output terminal 13 and nuts 11 are projected out of the case 16 through the guide opening 30a of the sheet 30 and the opening 16a of the case 16. The upper and lower reinforce ribs 30b are elastically fitted between an inner surface of the case 16 and the signal terminal part 12. It is not necessary for the guide rail 17 to have the shoulder 17b as shown in FIG. 2, because the printed circuit board 10 is also supported by the sheet.

The sheet 30 covers the overall face of the signal terminal part 12 except for the areas including the input/output terminal 13 and nuts 11. Thus, most of the electromagnetic wave generated from the signal terminal part 12 can be discharged into the ground through the chassis frame 14. It should also be noted that, since the elastic sheet 30 supports the construction between the signal terminal part 12, the chassis frame 14 and the case 16, quaking among them does not occur.

Figure 7:
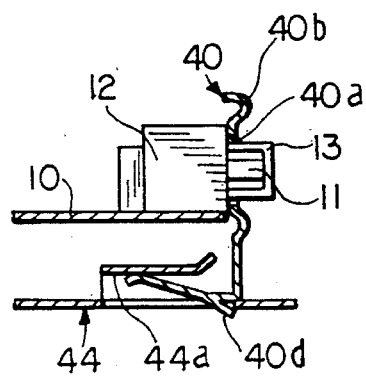
FIG. 7 is view illustrating a connector assembly configuration with the device shown in FIG. 6.
Figure 8:
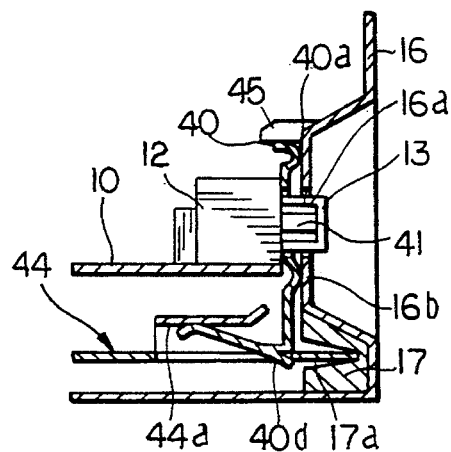
FIG. 8 is a cross-sectional view illustrating an arranged configuration with a signal terminal part mounted in a case of a system by means of the device shown in FIG. 6.

FIGS. 6 to 8 show the configurations with respect to the second embodiment according to the present invention. An elastic sheet 40 shown in FIG. 6 has a part including three guide openings, one (hereinbelow referred to as terminal guide opening 40a) for the input/output terminal 13, and the other two (hereinafter referred to as nut guide openings 40c) for the two nuts 11, wherein two reinforced ribs 40b of a curved shape are formed at upper and lower parts from the guide openings 40a and 40c. The elastic sheet 40 further has a bending portion 40d bent in an angle of more than 90° with respect to the other part. In bending portion 40d, latch mouth 40e is formed near the bend so the sheet 40 can fit into a suspending hollow 44a that is formed on chassis frame 44, as shown in FIG. 6.

Reference is now made to FIG. 7 to show the relationship between the sheet 40 and the chassis frame 44 as well as the use of the latch mouth 40e and the suspending hollow 44a. The latch mouth 40e is caught by an edge of the chassis frame 44 and a smooth end 44f of the bending portion 40d is elastically contacted with an inner surface of an upper plate of the suspending hollow 44a. As a result, the sheet 40 is tightly fitted into the suspending hollow 44a through the bending portion 40d. FIG. 8 illustrates the configuration of a complete combination among the signal terminal part 12, the sheet 40 and the case 16. The reinforce rib 40b formed at the upper part of the sheet 40 is stopped by a rib 45 projected from the inner surface of the case 16, which supports the sheet 40 thereupon together with the suspending of the latch mouth 40e in the hollow 44a.

Figure 9:
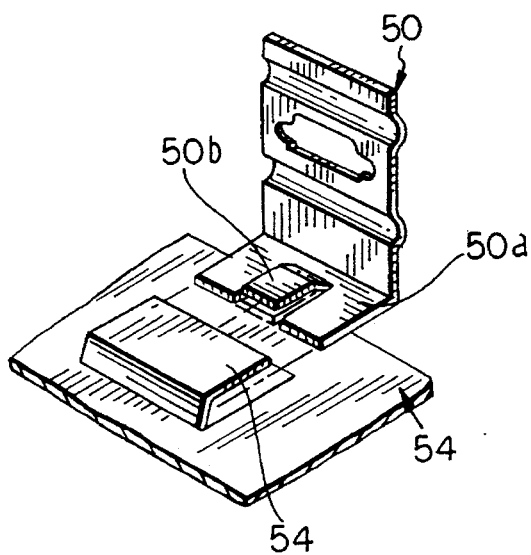
FIG. 9 is a perspective view illustrating a device according to a further embodiment of the present invention.
Figure 10:
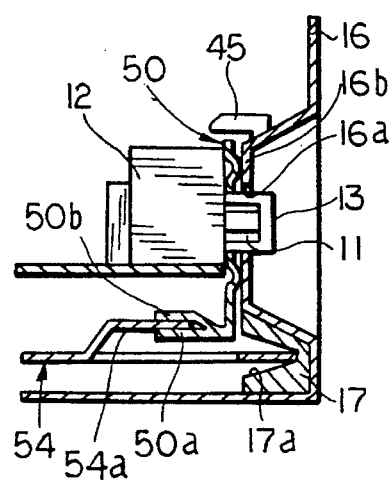
FIG. 10 is a cross-sectional view illustrating an arranged configuration with a signal terminal part mounted in a case of a system by means of the device shown in FIG. 9.

FIGS. 9 and 10 show the configurations with respect to the third embodiment according to the present invention. An elastic sheet 50 shown in FIG. 9 is similar to that shown in FIGS. 4 and 6, except that a bending portion 50a makes a right angle with the portion including the guide opening and the curving shaped reinforce ribs and a frame holder 50b is formed at the end of the bending portion 50a so that a connecting plate 54a projected from the surface of a chassis frame 54, as shown in FIG. 10, is inserted therein. The end of the sheet 50 near the upper reinforced ribs is supported by the rib 45 of the case 16 as is in FIG. 8.

In the three configurations aforementioned, the reinforced ribs support the space between the signal terminal part and the case, and the widths of the elastic sheets are sufficient to cover the surface of the signal terminal part 12 that faces the case 16.

As described above, the device for use with a connector assembly for data cable, including the sheet and chassis frame, stabilizes an assembly including the signal terminal part and the case even during quaking, provides a reliable shielding effect for the electromagnetic wave generated from the signal terminal part, and further has an advantage of easy fabrication.

Many of the techniques disclosed in this detailed description of the invention are exemplary only and it should be clear to one skilled in the art that alternate techniques may be employed in practicing this invention. Further, other techniques which are peripheral to the invention and well known in the art are not disclosed so as to prevent obscuring the invention with unnecessary detail.

What is claimed is:

1. A connector assembly for data cable comprising a signal terminal part fastened on a printed circuit board, said signal terminal part containing an input/output terminal fixed at one end of the signal terminal part, said input/output terminal having a plurality of pin holes formed at one side of the input/output terminal, said connector assembly further comprising:

elastic connecting means comprising a guide opening in the center thereof for inserting the input/output terminal to discharge electromagnetic waves generated around said input/output terminal to a chassis frame installed in a case of a main body in a computer system, wherein said elastic connecting means is a plate type spring comprising a pair of reinforcement ribs above and below said guide opening for firmly coupling the signal terminal part with the main body case; and fixing means for stably supporting said elastic connecting means in contacting relation with said chassis frame.

2. A connector assembly for data cable comprising a signal terminal part fastened on a printed circuit board, said signal terminal part containing an input/output terminal fixed at one end of the signal terminal part, said input/output terminal having a plurality of pin holes formed at one side of the input/output terminal, said connector assembly further comprising:

elastic connecting means comprising a guide opening in the center thereof for inserting the input/output terminal to discharge electromagnetic waves generated around said input/output terminal to a chassis frame installed in a case of a main body in a computer system, wherein said elastic connecting means is formed in a spring shape and comprises a pair of nut holes surrounding said guide opening and a jaw to prevent said elastic connecting means from being separated from said main body case; and fixing means for stably supporting said elastic connecting means in contacting relation with said chassis frame.

3. A connector assembly for data cable comprising a signal terminal part fastened on a printed circuit board, said signal terminal part containing an input/output terminal fixed at one end of the signal terminal part, said input/output terminal having a plurality of pin holes formed at one side of the input/output terminal, said connector assembly further comprising:

elastic connecting means comprising a guide opening in the center thereof for inserting the input/output terminal to discharge electromagnetic waves generated around said input/output terminal to a chassis frame installed in a case of a main body in a computer system; and fixing means for stably supporting said elastic connecting means in contacting relation with said chassis frame; wherein said fixing means comprises one part formed as one-piece with said chassis frame; said one part comprising a connecting plane for connection with one inserted end part of said elastic connecting means and a catching groove to prevent said elastic connecting means from being separated from said main body case.

4. A connector assembly as claimed in claim 3, wherein said elastic connecting means is formed in a spring shape and comprises a plurality of planes for engagement with said connecting plane of said fixing means.

5. A connector assembly as claimed in claim 1, wherein said plate type spring comprises a bending part for stable connection with said fixing means whereby to discharge electromagnetic waves generated around said signal terminal part to said chassis frame.

6. A connector assembly as claimed in claim 2, wherein said plate type spring is bent with an acute angle whereby to enable stable support of said elastic connecting means with said fixing means.

7. A connector assembly as claimed in claim 4, wherein said plurality of planes of said plate type spring engage said fixing means by said dividing said connecting plane of said fixing means.

8. An assembly comprising a grounding member, a signal terminal part, a frame, and a casing, the signal terminal part including an end face having a face portion through which electromagnetic waves are discharged and an input/output terminal which protrudes from the end face, said casing having receiving means for receiving said frame and an opening through which the input/output terminal protrudes when the assembly is in an assembled configuration with the frame received in the receiving means, said grounding member comprising an elastic material having a shielding portion and a connecting portion, the grounding member comprising rib means insertable between the signal terminal part and the casing for stabilizing the assembly when the assembly is in the assembled configuration, said shielding portion having a guide opening therethrough, said grounding member being configured so that the shielding portion is insertable between said connecting device and said casing with said input/output terminal protruding through the guide opening and with said connecting portion contacting said frame when the assembly is in the assembled configuration, said connecting portion including support means for enabling the grounding member to support said connecting device when the connecting portion is contacting the frame in the assembled configuration.

9. An assembly according to claim 8 wherein the shielding portion is configured so that it covers the face portion of the signal terminal part with the assembly in the assembled configuration whereby to provide a shield against the electromagnetic waves discharged from the face portion.

10. An assembly according to claim 9 wherein the grounding member is a metal plate spring.

11. An assembly according to claim 10 wherein the support means comprises a bent jaw.

* * * * *